United States Patent
Wanlass

[19]

[11] Patent Number: 6,069,047

[45] Date of Patent: May 30, 2000

[54] METHOD OF MAKING DAMASCENE COMPLETELY SELF ALIGNED ULTRA SHORT CHANNEL MOS TRANSISTOR

[76] Inventor: Frank M. Wanlass, 2655 Keystone Ave. Apt. 4, Santa Clara, Calif. 95051

[21] Appl. No.: 09/162,820

[22] Filed: Sep. 29, 1998

[51] Int. Cl.[7] .................................................. H01L 21/336
[52] U.S. Cl. ............................................ 438/305; 438/633
[58] Field of Search .................................... 438/303, 305, 438/306, 307, 626, 633, 645

[56] References Cited

U.S. PATENT DOCUMENTS

| | | | |
|---|---|---|---|
| 4,832,787 | 5/1989 | Bondur et al. | 216/18 |
| 5,169,487 | 12/1992 | Langley et al. | 438/714 |
| 5,387,556 | 2/1995 | Xiaobing et al. | 438/695 |
| 5,516,346 | 5/1996 | Cadien et al. | 51/308 |
| 5,597,764 | 1/1997 | Koh et al. | 438/633 |
| 5,702,981 | 12/1997 | Maniar et al. | 438/627 |
| 5,759,917 | 6/1998 | Grover et al. | 438/690 |
| 5,963,837 | 10/1999 | Ilg et al. | 438/633 |
| 5,970,375 | 10/1999 | Gardner et al. | 438/303 |

*Primary Examiner*—Chandra Chaudhari

[57] ABSTRACT

This invention is a damascene processing method for forming ultra short channel MOS transistors, where the channel length is not determined by photolithograpy. The method uses chemical mechanical polishing to self align an MOS transistor gate electrode to the MOS channel region in both the width and length directions. The method enables metal interconnect lines to make borderless connections to the MOS gate electrodes directly over channel regions, and allows borderless connections to be made to the MOS source and drain regions, thereby improving layout density of small transistors. The method uses metal for first level interconnect lines rather than polysilicon. The method enables the interconnect lines to be patterned on a planar surface, which facilitates the etching of very narrow and closely spaced lines. The method does not require any Shallow Trench Isolation (STI), and does not require Local Oxidation of Silicon (LOCOS), thereby resulting in little damage to the silicon substrate. The method also prevents plasma damage of very thin gate dielectrics during processing.

17 Claims, 5 Drawing Sheets

FIG. 2A   Side View

FIG. 2B   Top View

METHOD OF MAKING DAMASCENE COMPLETELY SELF ALIGNED ULTRA SHORT CHANNEL MOS TRANSISTOR

FIELD OF THE INVENTION

This invention is a damascene processing method for forming an MOS transistor where the channel length is less than 100 nm, where the gate electrode is self aligned to the channel region in both the width and length directions, and where the source and drain contact electrodes are self aligned to the source and drain diffusions, enabling metal interconnect lines to make borderless connection to the gate electrode and to the source and drain diffusions. The method does not require any defect generating heavy oxidation of the silicon.

BACKGROUND OF THE INVENTION

MOS silicon gate technology defines an MOS transistor location by a field oxide opening, and defines the MOS channel region location by a polysilicon gate electrode overlying this opening. The width of the polysilicon (poly) determines the channel length L, and the width of the field oxide opening determines the channel width W. The poly is made longer than the channel width to allow for misalignment tolerance. For a very narrow sub micron channel width this tolerance can be almost as large as the width. Furthermore, if a metal connection is to be made to the poly, the poly has to extend even further beyond the channel width to make room for a contact hole to the metal, severely limiting layout density.

Another fundamental problem with silicon gate technology arises from the fact that the polysilicon is used for a first layer interconnect as well as defining the MOS gate electrodes. This means that polysilicon cannot be patterned to freely cross over a diffusion without also creating an MOS transistor at the cross over location.

Yet another fundamental problem with silicon gate technology is that the channel length L is determined by the poly width, which width is determined by the width of radiation patterned photoresist. To produce ever faster circuits, it is desirable to make L as short as possible; however, it becomes very difficult to pattern photoresist line widths to be less than 100 nm.

SUMMARY OF THE INVENTION

The present invention is a method for forming MOS transistors in an integrated circuit, where the transistor gate electrodes are automatically aligned to the transistor channel regions in both the width and the length directions, and where interconnect metal can make borderless contact to the gate electrodes directly above the channel regions, and where interconnect metal can make borderless contact to the diffused source and drain regions of the transistors. These self aligning features enable the use of metal for first level interconnections between transistors rather than polysilicon, allowing transistors to be positioned in an integrated circuit only where desired. This invention also controls the MOS channel length using a method that does not depend on the exposure of very narrow photoresist lines.

In addition, this invention:
1- Allows the use of gate electrodes made from metal or other conductors.
2- Provides a planar surface for facilitating photo masking of very narrow and closely spaced first level metal interconnections.
3- Prevents plasma damage of gate dielectrics during processing.
4- Minimizes substrate defects by not using Local Oxidation of Silicon (LOCOS), or Shallow Trench Isolation (STI).

BRIEF DESCRIPTION OF THE DRAWINGS

FIGS. 2A and 2B show the wafer after applying and patterning photoresist that protects the amorphous silicon over the gate and contact regions.

DETAILED DESCRIPTION OF THE INVENTION

Figure 1A:
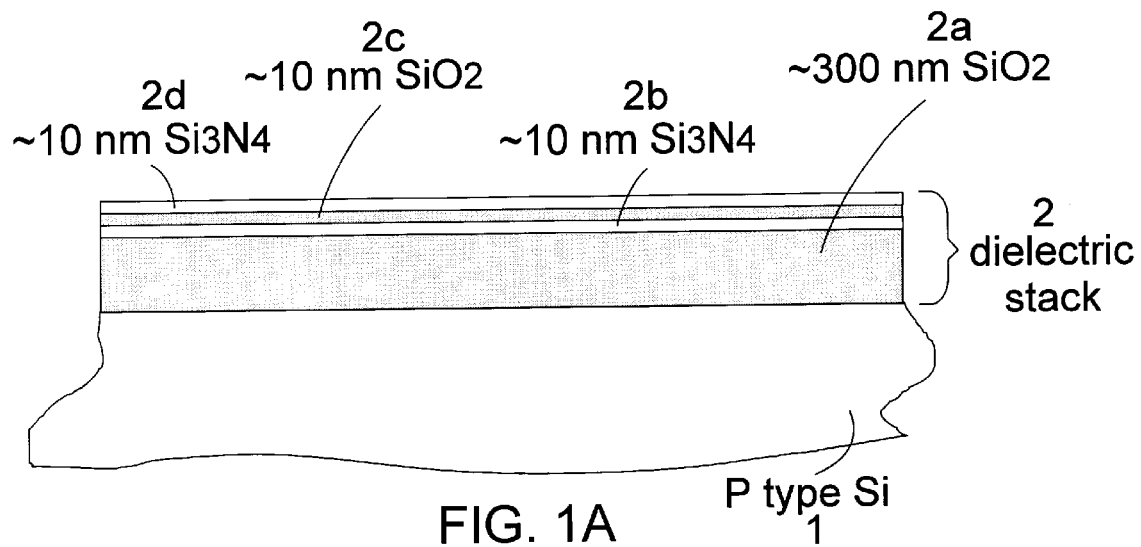
FIG. 1A shows a cross section of a portion of a P type silicon wafer coated with a multilayer dielectric.

The following is a description of a preferred process flow for forming a completely self aligned NMOS transistor, with an ultra short channel length; the steps for forming PMOS transistors are not described, but would be the same except for the use of a P+ implants instead of an N+ implants, and the use of N− implants instead of P− implants:

1. FIG. 1A shows, at the start of the process, a portion of a P type single crystal silicon substrates coated with dielectric multilayer 2, consisting of a first layer 2a of silicon dioxide ($SiO_2$) ~300 nm thick, followed by a layer 2b of silicon nitride ($Si_3N_4$) ~10 nm thick, followed by a layer 2c of $SiO_2$ ~10 nm thick, followed by a layer 2d of $Si_3N_4$ ~10 nm thick.

Figure 1B:
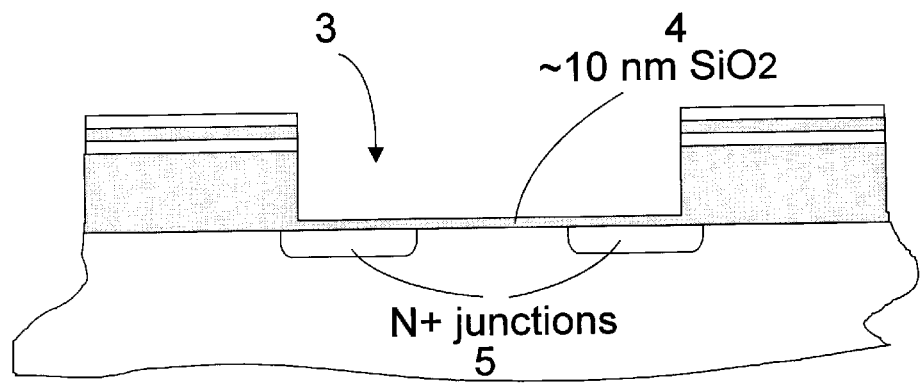
FIG. 1B shows an opening through the multilayer with thin silicon dioxide at the opening bottom, and after forming the first N+ junctions.

2. Photoresist is patterned and the $Si_3N_4$ layer 2d is anisotropically plasma etched using chlorine chemistry, then the $SiO_2$ layer 2c is anisotropically plasma etched using fluorine chemistry, then the $Si_3N_4$ layer 2b is anisotropically etched using chlorine chemistry, and finally the $SiO_2$ layer 2a is anisotropically etched using fluorine chemistry, stopping at the silicon substrate, resulting in opening 3 as shown in FIG. 1B. U.S. Pat. No. 4,832,787 to James A. Bondur et al. describes a preferred etch for the chlorine chemistry, that etches $Si_3N_4$ much faster than $SiO_2$. U.S. Pat. No. 5,702,981 to Papu D. Maniar et al., describes a preferred etch for the fluorine chemistry using $C_2F_6$ or $C_3F_8$, that etches $SiO_2$ much faster than $Si_3N_4$. The opening 3 will determine the position of a subsequent NMOS transistor, and is representative of many such openings in an integrated circuit.

3. Using patterned photoresist as a mask, N+ dopant is implanted and diffused in the underlying silicon substrate beneath opening 3 to make two N+ junctions 5 as shown in FIG. 1B; this photoresist is patterned to protect against implanting a portion of silicon beneath opening 3 somewhat larger than the channel of the subsequent NMOS transistor. The junctions 5 are relatively deep, and diffuse sideways under the sidewalls of opening 3. Also a thin layer 4 of $SiO_2$ ~10 nm thick is grown at the bottom of opening 3 as shown in FIG. 1B.

Figure 1C:
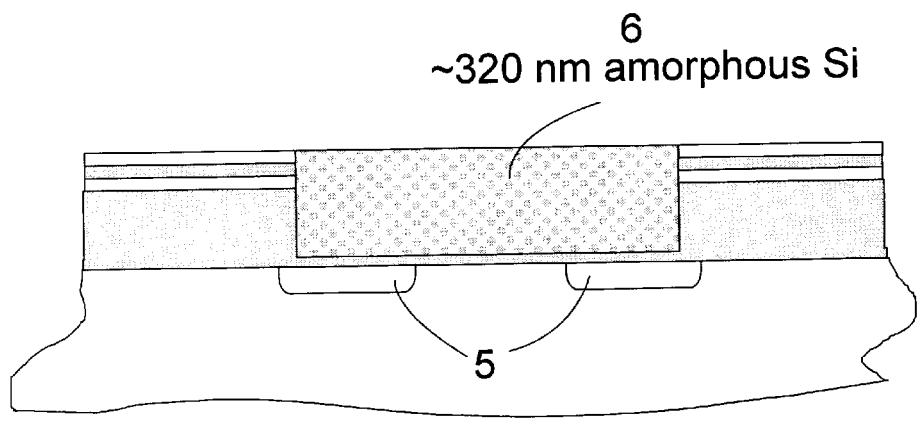
FIG. 1C shows the wafer after amorphous silicon deposition and planarizing.

4. Amorphous silicon 6 is deposited that is thicker than 320 nm, so that it overfills opening 3. Chemical mechanical polishing is performed on the amorphous silicon 6 using $Si_3N_4$ layer 2d as a polish stop, resulting in the amorphous silicon 6 remaining only in opening 3, and the top surface of amorphous silicon 6 being coplanar with the top surface of layer 2d, as shown in FIG. 1C. This polishing can be accomplished with a polishing pad using a slurry containing potassium hydroxide (KOH) and very small silica or alumina particles.

Figure 2C:
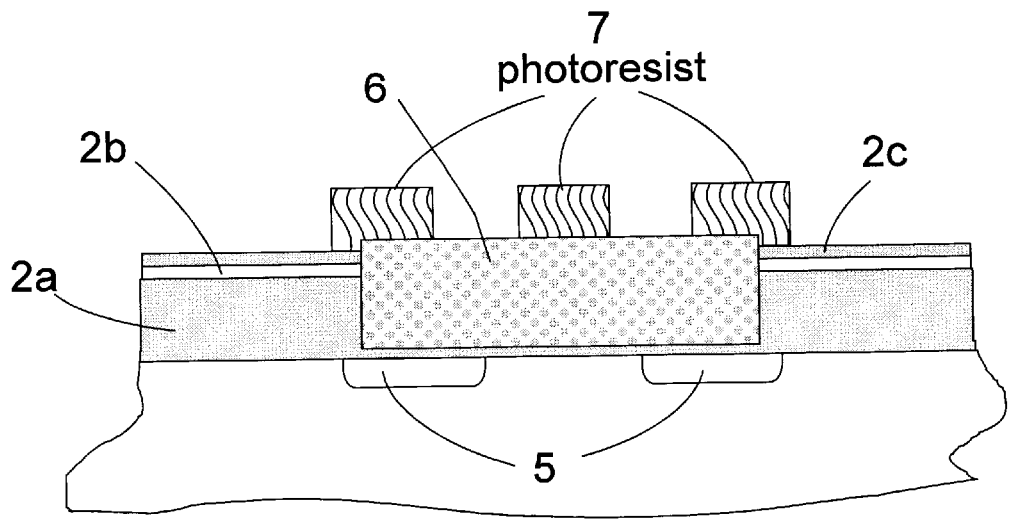
FIG. 2C shows the wafer after removing the amorphous silicon between the gate region and the contact regions.
Figure 2C:
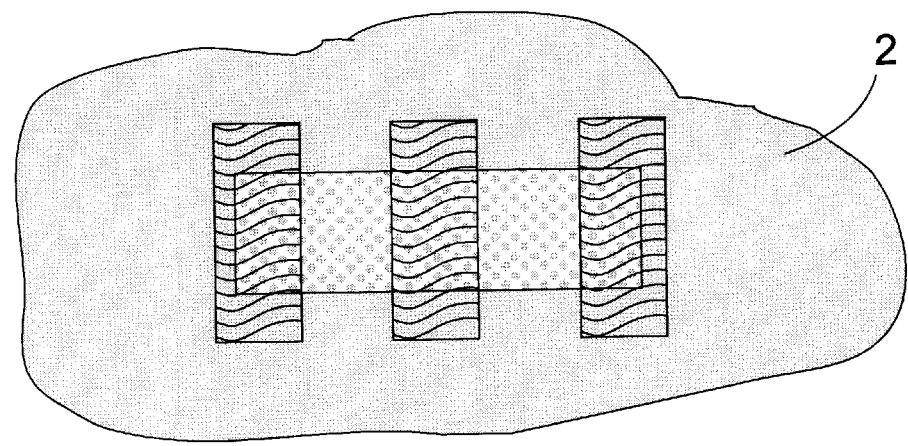
Figure 2C:
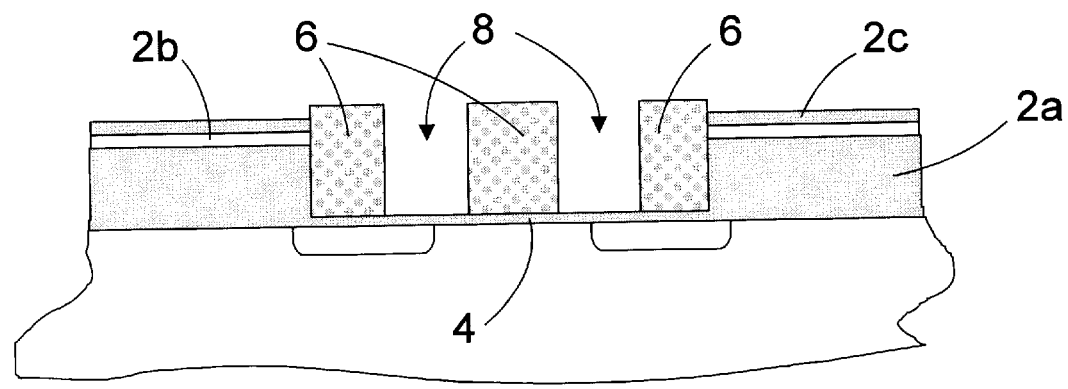

5. The thin layer 2d of $Si_3N_4$ is removed by chlorine plasma etching, or by hot phosphoric acid etching. Photoresist 7 is applied and patterned as shown in FIGS. 2A and 2B, protecting the amorphous silicon 6 lying over subsequent channel and contact regions. The amorphous silicon 6 not protected by photoresist is anisotropically plasma etched, stopping at the underlying thin $SiO_2$ layer 4, resulting in openings 8 as shown in FIG. 2C. This is preferably a bromine or chlorine based plasma that etches $SiO_2$ much more slowly than silicon, and produces near vertical sidewalls for the amorphous silicon. U.S. Pat. No. 5,169,487 to Rod C. Langley et al. describes a preferred plasma chemistry for this etch.

Figure 3A:
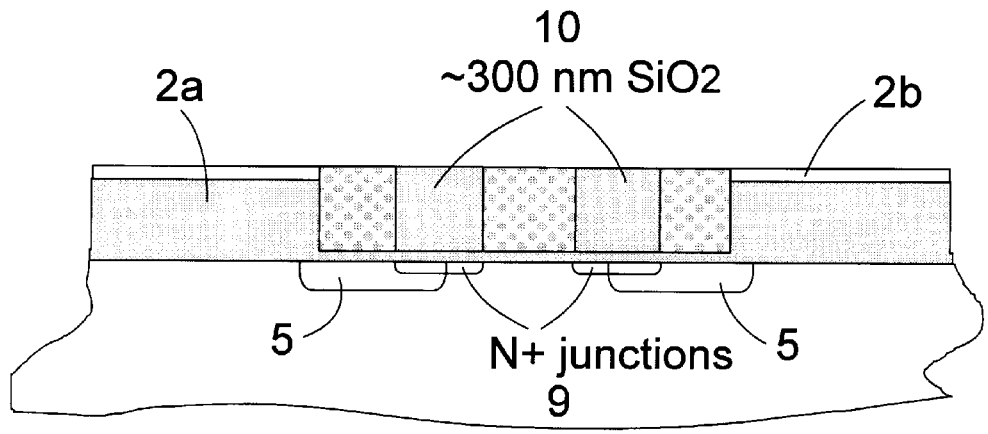
FIG. 3A shows the wafer after forming the second N+ junctions, after depositing a thick layer of silicon dioxide, and after chemical mechanical polishing the silicon dioxide.

6. Before removing photoresist 7 a shallow N+ donor implant is performed; and after photoresist 7 removal this implant is activated and diffused to form junctions 9. The implant energy should be very low because only the thin layer 4 has to be penetrated. Next $SiO_2$ material 10 is deposited to a thickness that overfills the openings 8. This $SiO_2$ can be deposited from tetraethylorthosilicate gas in a mixture with ozone at a temperature of approximately 400° C. Chemical mechanical polishing is performed on material 10, using $Si_3N_4$ layer 2b as a polish stop, resulting in material 10 remaining only in openings 8, with the top surface of material 10 being coplanar with the top surface of layer 2b. This polishing will also remove layer 2c and some of material 6. This polishing can be best accomplished as described in U.S. Pat. No. 5,759,917 to S. Grover Gautam et al.; this patent describes a slurry that preferentially polishes $SiO_2$ much faster than $Si_3N_4$. FIG. 3A shows the result of these steps.

7. Layer 2b is removed by a short plasma etch, or by a wet etch. The remaining amorphous silicon is removed by a selective plasma silicon etch of the type used in step 5, or removed by a wet etch, resulting in contact openings 11 and a gate opening 12. A brief chemical mechanical polishing can be performed to smooth the top surface of layer 2a. Next a thin layer 13 of amorphous silicon ~30 nm thick is deposited. A very shallow N+ implant is performed through layer 13 into the bottom of opening 12, which is activated and diffused to create a junction 14 beneath opening 12.

Figure 3B:
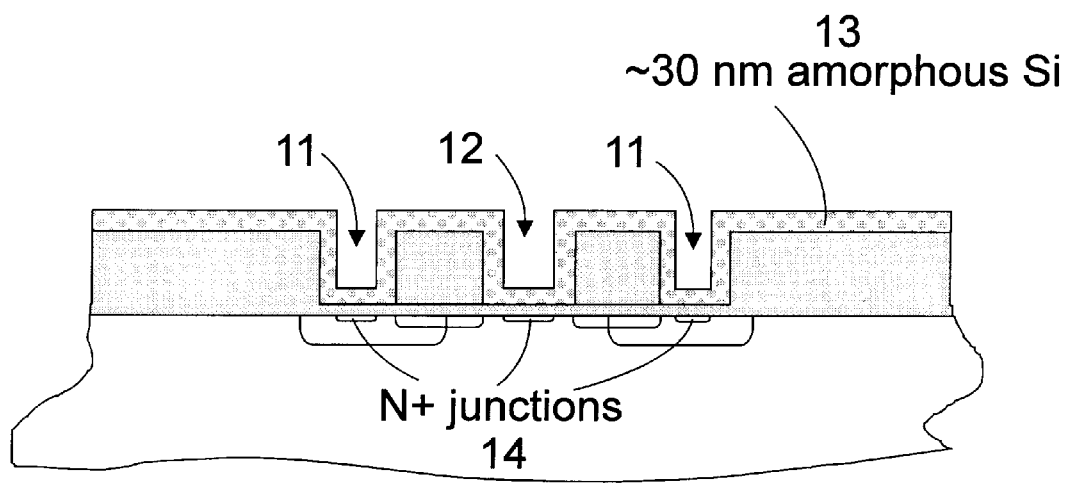
FIG. 3B shows the wafer removing the remaining amorphous silicon, after depositing a new thin layer of amorphous silicon, and after forming the third N+ junctions.

No N+ implant will penetrate the silicon substrate beneath the coating of amorphous silicon on the sidewalls of opening 12, thereby creating very small spaces between junction 14 at the bottom of opening 12 and junctions 9. These spaces between junction 14 at the bottom of opening 12 and the junctions 5 will be approximately equal to the thickness of layer 13. The fact that junctions 14 also form below openings 11 is of no consequence because deep N+ junctions already exist below openings 11. The results of these steps are shown in FIG. 3B.

8. By masking opening 12 with photoresist it is possible to prevent a junction 14 from forming beneath opening 12. This will allow the forming of a non ultra short transistor with a channel length determined by the spacing between junctions 9. This will require no extra masking steps because in a CMOS process the N+ implant that forms junctions 14 has to be masked with photoresist anyway. Therefore, both ultra short channel transistors and regular channel transistors can be formed in the same process.

Figure 3C:
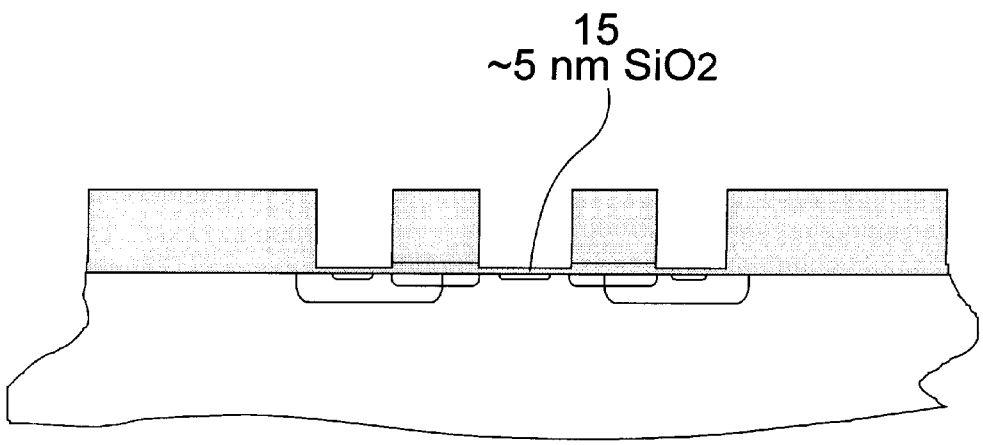
FIG. 3C shows the wafer after removing the thin amorphous silicon and after growing a thin gate silicon dioxide.

9. The amorphous silicon 13 is removed by a plasma etch or a wet etch. A short $SiO_2$ etch is performed and a new gate dielectric 15 of $SiO_2$ ~5 nm thick is grown and annealed at the bottom of opening 12; approximately the same thickness of $SiO_2$ will grow on the bottoms of openings 11. This is shown in FIG. 3C.

Figure 4A:
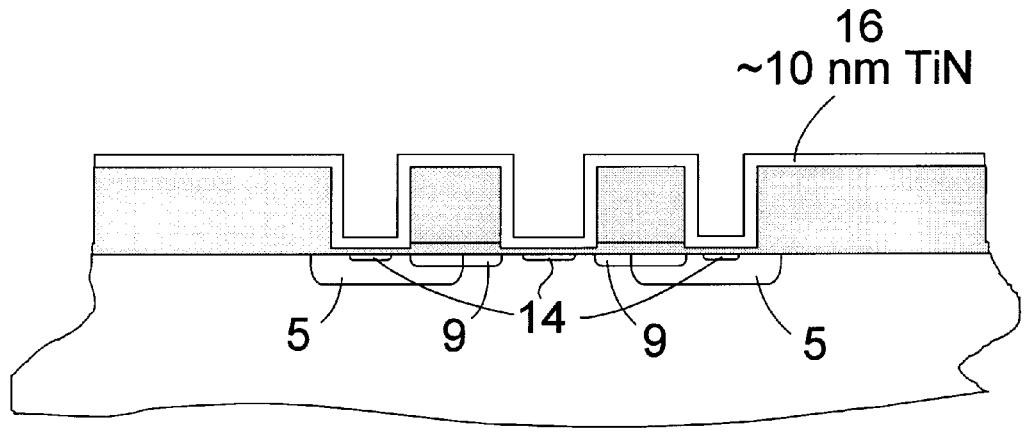
FIG. 4A shows the wafer after depositing a thin layer of TiN.

10. A thin conformal layer 16 of titanium nitride (TiN) ~10 nm thick is deposited as shown in FIG. 4A.

Figure 4B:
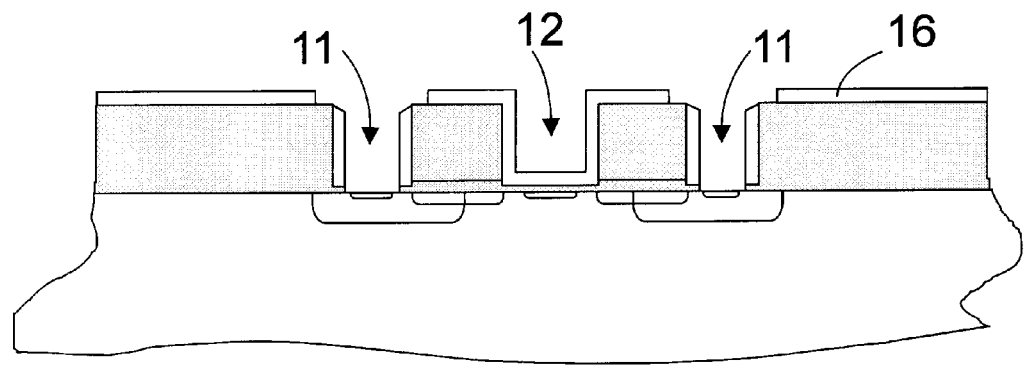
FIG. 4B shows the wafer after etching the TIN and the thin silicon dioxide over the contact regions.

11. Photoresist is patterned to expose openings 11 and the TiN is plasma etched, removing the TiN at the bottom of openings 11. This etch can be performed using a chemistry of chlorine and helium as described in U.S. Pat. No. 5,035,768 to Xiao-Chun Mu et al. With the photoresist still in place the $SiO_2$ at the bottoms of openings 11 is anisotropically plasma etched using fluorine chemistry stopping at the silicon substrate. As shown in FIG. 4B the photoresist openings that expose openings 11 preferably should be slightly larger than the openings 11 to allow for misalignment; however, as long as there is some exposure of the bottom of openings 11 there will be contact openings to junctions 5.

Figure 4C:
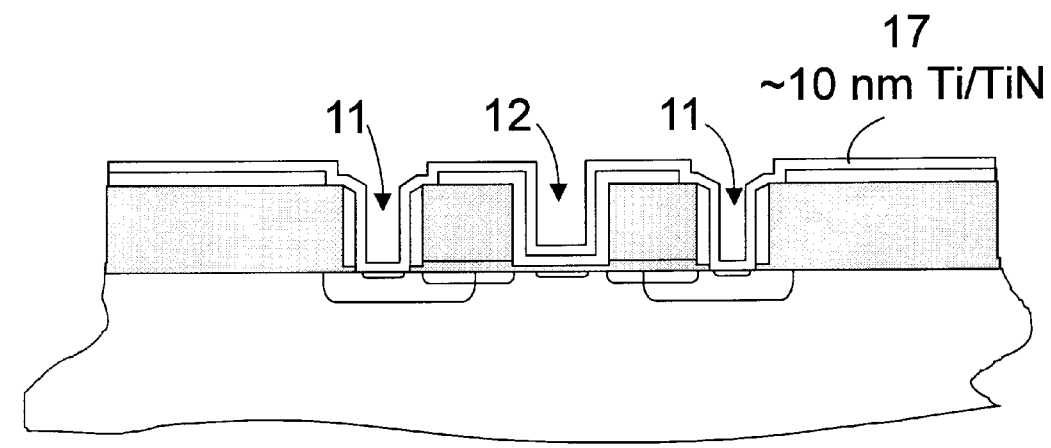
FIG. 4C shows the wafer after depositing a thin bilayer of Ti/TiN.

12. A double layer 17 is deposited consisting of a first thin layer of titanium (Ti) ~5 nm thick, followed by a thin layer of TiN ~5 nm thick. The Ti assures an ohmic contact to the N+ diffusions 5. This is shown in FIG. 4C.

Figure 5A:
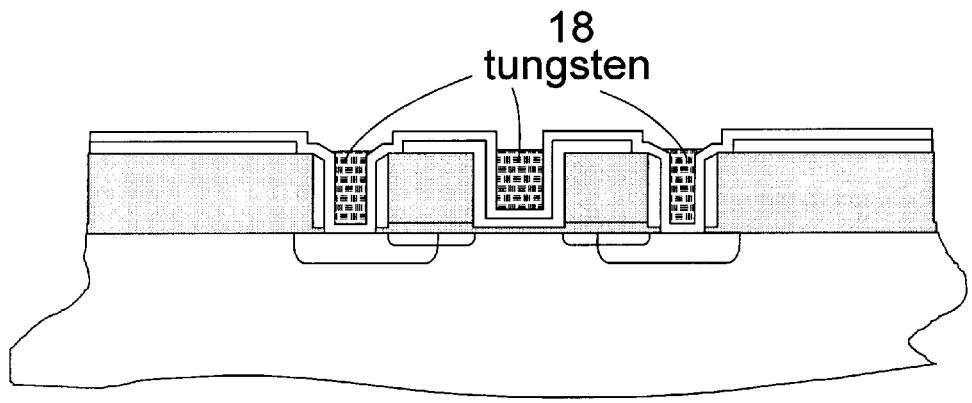
FIG. 5A shows the wafer after depositing tungsten and planarizing.

13. Tungsten (W) material 18 is deposited to a thickness to overfill contact openings 11, and gate opening 12. The TiN of bilayer 17 acts as a barrier layer to prevent the interaction of W material 18 with Ti or with the underlying silicon substrate. Material 18 is chemically mechanically polished using either layer 16 or layer 17 as a polish stop, resulting in material 18 remaining only in contact openings 11 and gate opening 12. A slight over polish will remove any tungsten on the upper lips of openings 11, as shown in FIG. 5A. This polish is best performed as described in U.S. Pat. No. 5,516,346 to K. C. Cadien.

Figure 5B:
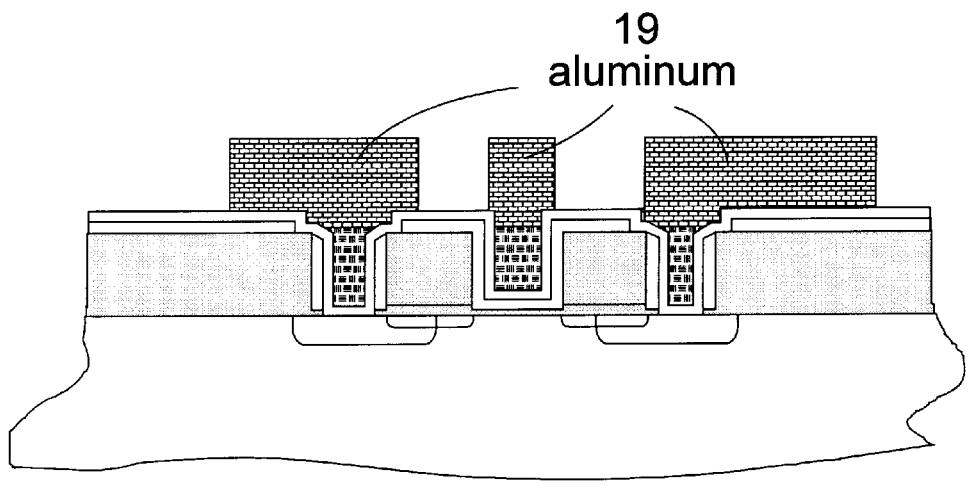
FIG. 5B shows the wafer after depositing aluminum and after patterning the aluminum.
Figure 5C:
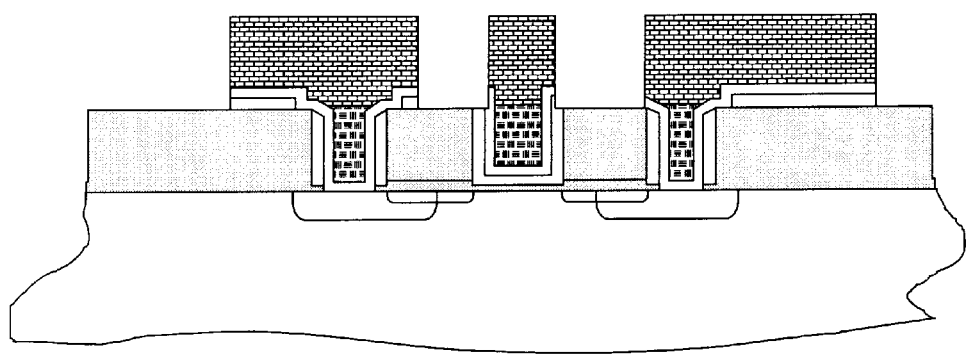
FIG. 5C shows the wafer after etching the trilayer of TiN/Ti/TiN not covered by aluminum.

14. A thick layer 19 of ~300 nm aluminum is deposited. Photoresist is applied and patterned to define interconnects. The aluminum is anisotropically plasma etched in a chlorine chemistry, which will also etch the underlying thin layers of Ti or TiN; chlorine chemistry will not appreciably etch the tungsten 18 if it is exposed due to misalignment. FIGS. 5B and 5C show this. U.S. Pat. No. 5,387,556 to Diane M. Xiaobing et al. is one of many U.S. patents that describe suitable chlorine based plasma etches for aluminum.

Because the thin underlying layer 16 is not removed until after the aluminum is patterned, there are never any electrically floating gates during processing that might be plasma damaged.

15. The above preferred process flow could also be applied to a silicon-on-insulator (SOI) substrate 1 consisting of a thin film of silicon resting on an insulating substrate, or resting on an oxidized silicon wafer. This process would eliminate the need in an SOI circuit to isolate the SOI transistors by etching them apart.

What is claimed is:

1. A processing method for forming completely self aligned gate and contact regions for an ultra short MOS transistor, comprised of the following steps:

a) coating a single crystal silicon substrate 1 with a dielectric multilayer 2 consisting of one or more layers;
 b) etching an opening 3 through multilayer 2, where the area of opening 3 equals the combined source, drain and channel areas of the subsequent MOS transistor;
 c) growing or depositing a thin dielectric layer 4 at the bottom of opening 3;
 d) implanting and diffusing junctions 5 (either N+ for NMOS or P+ for PMOS) into into the silicon substrate at the bottom of opening 3, except not into the area at the bottom of opening 3 that will include the channel region of the subsequent MOS transistor, where this area is larger than the MOS channel area to allow for misalignment;
 e) depositing a layer of material 6 thicker than the depth of opening 3;
 d) planarizing material 6 to a height coplanar with the top surface of multilayer 2, leaving material 6 only in opening 3;
 f) removing material 6 from portions of opening 3, leaving material 6 in opening 3 only where the subsequent MOS transistor gate region and source and drain contact regions will be positioned, resulting in material 6 being removed from openings 8 within opening 3;
 g) implanting and diffusing junctions 9 (either N+ for NMOS or P+ for PMOS) into the silicon substrate beneath openings 8;
 h) depositing a dielectric material 10 thicker than the depth of openings 8;
 i) planarizing material 10 to a height where the top surface of material 10 is coplanar with dielectric multilayer 2;
 j) removing the remaining material 6 exposing layer 4 in contact openings 11 positioned over junctions 5, and exposing layer 4 in gate opening 12 positioned over the subsequent channel region of the MOS transistor;
 k) depositing a layer of material 13 to conformably coat all exposed wafer surfaces, where the thickness of material 13 is approximately equal to one half the desired channel length of the subsequent MOS transistor;
 l) implanting and diffusing junctions 14 (either N+ for NMOS or P+ for PMOS) into the silicon substrate beneath openings 11 and 12, but not beneath the material 13 coating the sidewalls of openings 11 and 12, and then removing all of material 13;
 m) removing all or a portion of layer 4 at the bottoms of openings 11 and 12, and creating the final MOS transistor gate dielectric 13 at the bottom of opening 12.

2. A processing method for forming a completely self aligned ultra short channel MOS transistor, comprised of the following steps:

a) coating a single crystal silicon substrate 1 with a dielectric multilayer 2 consisting of one or more layers;
 b) etching an opening 3 through multilayer 2, where the area of opening 3 equals the combined source, drain and channel areas of the subsequent MOS transistor;
 c) growing or depositing a thin dielectric layer 4 at the bottom of opening 3;
 d) implanting and diffusing junctions 5 (either N+ for NMOS or P+ for PMOS) into into the silicon substrate at the bottom of opening 3, except not into the area at the bottom of opening 3 that will include the channel region of the subsequent MOS transistor, where this area is larger than the MOS channel area to allow for misalignment;
 e) depositing a layer of material 6 thicker than the depth of opening 3;
 d) planarizing material 6 to a height coplanar with the top surface of multilayer 2, leaving material 6 only in opening 3;
 f) removing material 6 from portions of opening 3, leaving material 6 in opening 3 only where the subsequent MOS transistor gate region and source and drain contact regions will be positioned, resulting in material 6 being removed from openings 8 within opening 3;
 g) implanting and diffusing junctions 9 (either N+ for NMOS or P+ for PMOS) into the silicon substrate beneath openings 8;
 h) depositing a dielectric material 10 thicker than the depth of openings 8;
 i) planarizing material 10 to a height where the top surface of material 10 is coplanar with dielectric multilayer 2;
 j) removing the remaining material 6 exposing layer 4 in contact openings 11; positioned over junctions 5, and exposing layer 4 in gate opening 12 positioned over the subsequent channel region of the MOS transistor;
 k) depositing a layer of material 13 to conformably coat all exposed wafer surfaces, where the thickness of material 13 is approximately equal to one half the desired channel length of the subsequent MOS transistor;
 l) implanting and diffusing junctions 14 (either N+ for NMOS or P+ for PMOS) into the silicon substrate beneath openings 11 and 12, but not beneath the material 13 coating the sidewalls of openings 11 and 12, and then removing all of material 13;
 m) removing all or a portion of layer 4 at the bottoms of openings 11 and 12, and creating the final MOS transistor gate dielectric 13 at the bottom of opening 12;
 n) depositing a thin conformal coating of a conductive material 16;
 o) masking and etching completely through the material 16 at the bottom of openings 11, and etching completely through any material below material 16 at the bottom of openings 11 stopping at the junctions 5 in the underlying silicon substrate;
 p) depositing a thin multilayer 17 consisting of one or more layers, where this multilayer is conformal, makes ohmic contact to junctions 5, and adheres well to layer 16;
 q) overfilling openings 11 and 12 with a conductor 18 and planarizing conductor 18 so that the top surface of 18 is coplanar with either the top surface of layer 17 or layer 16;
 r) depositing and patterning interconnect conductor 19 with photoresist;

t) etching conductor 19 into a pattern, and etching layers 16 and 17 not covered by conductor 19, stopping the etch at multilayer 2.

3. The method of claim 1, where material 6 is anisotropically etched in step (f).

4. The method of claim 1, where material 6 is partially anisotropically etched in step (f), and the anisotropic etching is finished after step (g) and before step (h).

5. The method of claim 2, where layer 16 is titanium nitride.

6. The method of claim 2, where multilayer 17 consists of a first thin layer 17*a* of titanium, followed by a thin layer 17*b* of titanium nitride.

7. The method of claim 2, where the layer 18 is chemical mechanically polished using any of layers 17*b*, 17*a* or 16 as a polish stop.

8. The method of claim 1, where one or more light ion implants are made through opening 12 into substrate 1 between steps (j) and (l), for purposes of punch through control or threshold control.

9. The method of claim 1, where two or more ion implants are made in step (g) to control the junction profiles, for minimization of hot carrier problems.

10. The method of claim 1, where one or more light ion implants are made after step (b) through dielectric layer 2 for field threshold control.

11. The method of claim 2, where layer 19 is either aluminum or a double layer of first titanium followed by aluminum.

12. The method of claim 1, where a well is formed in substrate 1 by implanting and diffusing a dopant either before step (a) or between steps (b) and (c).

13. The method of claim 2, where a well is formed in substrate 1 by implanting and diffusing a dopant either before step (a) or between steps (b) and (c).

14. The method of claim 1, where photoresist protects opening 12 from the implant that forms junctions 14 during step (l).

15. The method of claim 1, where steps (k) and (l) are skipped.

16. The method of claim 2, where layer 19 includes copper.

17. The method of claim 1, where substrate 1 is a thin film of silicon on either an insulating substrate or on an oxidized silicon substrate.

* * * * *